(12) United States Patent
Oh et al.

(10) Patent No.: US 9,343,391 B2
(45) Date of Patent: May 17, 2016

(54) SEMICONDUCTOR PACKAGE AND METHOD OF MANUFACTURING THE SAME

(71) Applicant: SAMSUNG ELECTRO-MECHANICS CO., LTD., Suwon-Si (KR)

(72) Inventors: Kyu Hwan Oh, Suwon-Si (KR); Do Jae Yoo, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 14/296,061

(22) Filed: Jun. 4, 2014

(65) Prior Publication Data

US 2015/0137339 A1    May 21, 2015

(30) Foreign Application Priority Data

Nov. 20, 2013  (KR) .......................... 10-2013-0141570

(51) Int. Cl.
| | |
|---|---|
| *H01L 31/062* | (2012.01) |
| *H01L 23/48* | (2006.01) |
| *H01L 21/56* | (2006.01) |
| *H01L 21/768* | (2006.01) |
| *H01L 23/31* | (2006.01) |

(52) U.S. Cl.
CPC ............ *H01L 23/481* (2013.01); *H01L 21/565* (2013.01); *H01L 21/76816* (2013.01); *H01L 23/3121* (2013.01); *H01L 2224/18* (2013.01); *H01L 2924/0002* (2013.01)

(58) Field of Classification Search
CPC ........................ H01L 21/76898; H01L 23/481
USPC ............................................. 257/291; 438/48
See application file for complete search history.

(56) References Cited

U.S. PATENT DOCUMENTS

2010/0220448 A1* 9/2010 Nomura ........................ 361/746
2012/0320536 A1   12/2012 Yamamoto

* cited by examiner

*Primary Examiner* — Theresa T Doan
(74) *Attorney, Agent, or Firm* — NSIP Law

(57) ABSTRACT

Disclosed herein are a semiconductor package and a method of manufacturing the same. The semiconductor package includes: a substrate including a mounting electrode formed on both sides and a wiring; a plurality of first electronic devices mounted on the substrate; a second electronic devices mounted on the substrate; and a via through which the wiring of the substrate and the second electronic devices are connected.

3 Claims, 3 Drawing Sheets

SEMICONDUCTOR PACKAGE AND METHOD OF MANUFACTURING THE SAME

CROSS REFERENCE TO RELATED APPLICATION

This application claims the benefit of Korean Patent Application No. 10-2013-0141570, filed on Nov. 20, 2013, entitled "Semiconductor Package and Method of Manufacturing the Same," which is hereby incorporated by reference in its entirety into this application.

BACKGROUND OF THE INVENTION

1. Technical Field

The present invention relates to a semiconductor package and a method of manufacturing the same.

2. Description of the Related Art

Each year the demand of mobile electronic products in the electronic product market is rapidly increasing.

Accordingly, a semiconductor package that is mounted in these products and a semiconductor device mounted on a substrate have to be compact and light-weight.

Also, in order to perform multiple functions at the same time, many semiconductor devices are packaged at a high density and a high integration degree.

Due to this trend, recent electronic appliances are developed as integrally systemized modules, and thus, a semiconductor package size is gradually reduced, and a mounting density of an electronic device is also increasing.

In addition, as a method of integrating various packages is developed to form a single integrated type package, a double side packaging technique in which both sides of a printed circuit board (PCB) are used has become important.

PRIOR ART DOCUMENT (Patent Document 1) US Patent Application Publication No. 2012-0320536

SUMMARY OF THE INVENTION

The present invention has been made in an effort to provide a semiconductor package that allows a compact electronic appliance and a method of manufacturing the semiconductor package.

According to a first preferred embodiment of the present invention, there is provided a semiconductor package, including: a substrate including a mounting electrode formed on both sides and a wiring; a plurality of first electronic devices mounted on the substrate; a plurality of second electronic devices mounted on the substrate; and a via through which the wiring of the substrate and the plurality of second electronic devices are connected.

The semiconductor package may further include a molding portion that covers the substrate, the first and second electronic devices, and the via.

The via may have a uniform length or different lengths.

The via may have a uniform thickness or different thicknesses.

According to a second preferred embodiment of the present invention, there is provided a method of manufacturing a semiconductor package, including: preparing a substrate on which a mounting electrode formed on both sides and a wiring are formed; mounting a plurality of first electronic devices on the substrate; forming a molding portion that seals the substrate and the first electronic devices; forming a via that is electrically connected to the substrate, in the molding portion; and mounting a second electronic device on the via.

The molding portion may be an epoxy molding compound (EMC).

The method may further include, after the forming of the molding portion, boring a portion of the molding portion according to the shape of the second electronic device.

The boring may be performed by laser processing.

The forming of the via may include: forming a via hole by laser processing; and filling the via hole by plating.

The via may have a uniform length or different lengths.

The via may have a uniform thickness or different thicknesses.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
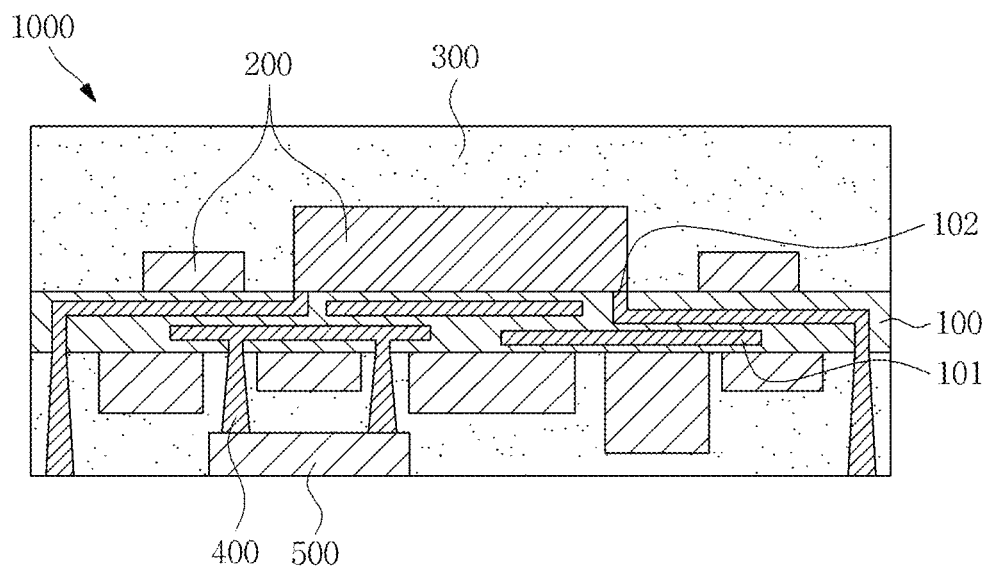
FIG. 1 is a schematic cross-sectional view illustrating a structure of a semiconductor package according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Semiconductor Package

Preferred Embodiment

FIG. 1 is a schematic cross-sectional view illustrating a structure of a semiconductor package 1000 according to a preferred embodiment of the present invention.

Referring to FIG. 1, the semiconductor package 1000 according to the preferred embodiment of the present invention may include a substrate 100, a via 400, a first electronic device 200, a second electronic device 500, and a molding portion 300.

The substrate 100 may be formed of various types of substrates.

For example, a ceramic substrate, a printed circuit board (PCB), a flexible substrate, or a rigid flexible substrate may be used, but is not limited thereto, and any substrate well-known in the art may be used.

Here, a mounting electrode 102 for mounting the first electronic device 200 on both sides of the substrate 100 may be formed on the substrate 100, and internal wiring 101 to electrically connect the mounting electrode 102 may be formed in the substrate 100.

Also, the substrate 100 according to the preferred embodiment of the present invention may be a single layer or a multi-layer substrate including at least one layer. Also, a circuit pattern (not shown) for electrical connection may be formed between respective layers.

Here, while not shown in the drawings, an external connection terminal for connection to the outside may be formed on the substrate 100. At least one external connection terminal may be formed, and the via 400, which will be described later, may function as an external connection terminal of the substrate 100.

Next, the mounting electrode 102 formed on the substrate 100 and the wiring 101 formed in the substrate 100 may be electrically connected to other substrates (not shown) and/or the second electronic device 500 through the via 400.

At least one via 400 may be formed, and the vias 400 may have a uniform length or thickness or different lengths and thicknesses.

A filler of the via 400, through which the substrate 100 and the second electronic device 500 that is mounted at a distance from the substrate 100 are electrically connected, may be any material formed of a conductive metallic material without being limited, and copper is typically used.

Here, as the first electronic device 200, any various devices that may be mounted on the substrate 100, including a passive device and an active device, may be used.

The first electronic device 200 may be mounted on both an upper surface and a lower surface of the substrate 100, in which the mounting electrode 102 is formed on both sides thereof. The size or shape of the first electronic device 200 may be variously disposed according to the design of the semiconductor package 1000.

The second electronic device 500 that is mounted at a distance from the substrate 100, described above, may be electrically connected to the substrate 100 through the conductive via 400.

As the second electronic device 500, various devices such as a passive device and an active device may be used.

The size or shape may be variously changed according to a type and arrangement of an electronic device that a designer desires.

As the second electronic device 500 is connected to the substrate 100 through the via 400, the number and an area of electronic devices mounted on the substrate 100 may be reduced, thereby reducing a size of the semiconductor package 1000.

The molding portion 300 that surrounds the substrate 100, the via 400, and the first and second electronic devices 200 and 500 is formed on the substrate 100 to thereby increase an adhesive force between the molding and the substrate 100.

Accordingly, as the problem such as delamination between the substrate 100 and a molding material may be reduced, long-time reliability of the substrate 100 may be improved.

In addition, as heat is blocked due to the molding, heat radiation effects may be further improved.

The molding portion 300 may be formed of, for example, a silicone gel or an epoxy molding compound (EMC), but is not limited thereto.

Also, the molding portion 300 is filled between the first and second electronic devices 200 and 500 mounted on the substrate 100, thereby preventing an electrical short circuit between the electronic devices.

Also, the molding portion 300 surrounds the outside of the electronic devices to fix the same, thereby safely protecting the electronic devices from an external impact.

The molding portion 300 may be formed of an insulating material including a resin material, such as an epoxy or the like.

Method of Manufacturing Semiconductor Package

Preferred Embodiment

FIGS. 2 through 6 are cross-sectional views sequentially illustrating a method of manufacturing a semiconductor package 1000 according to a preferred embodiment of the present invention.

Figure 2:
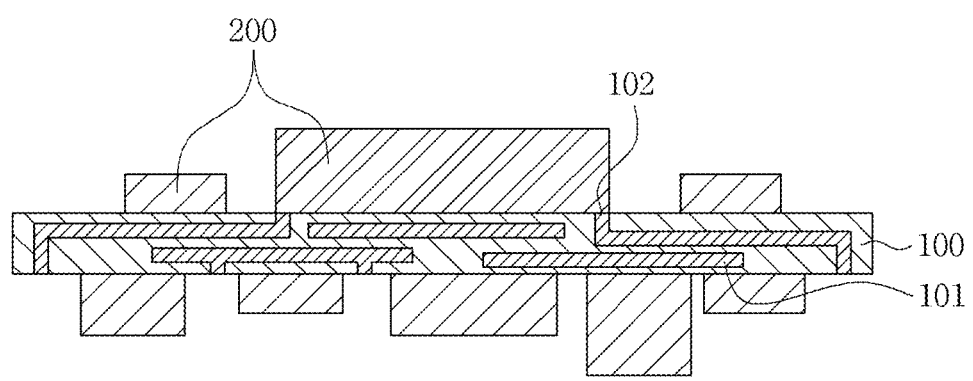
FIGS. 2 through 6 are cross-sectional views sequentially illustrating a method of manufacturing a semiconductor package according to a preferred embodiment of the present invention.

First, referring to FIG. 2, a plurality of first electronic devices 200 are mounted on a substrate on which a mounting electrode 102 for both sides and a wiring 101 are formed.

The substrate 100 may be formed of various types of substrates.

For example, a ceramic substrate, a printed circuit board (PCB), a flexible substrate, or a rigid flexible substrate may be used, but is not limited thereto, and any substrate well-known in the art may be used.

Here, the mounting electrode 102 for mounting the first electronic device 200 on both sides of the substrate 100 may be formed on the substrate 100, and internal wiring 101 for electrical connection of the mounting electrode 102 may be formed in the substrate 100.

Also, the substrate 100 according to the preferred embodiment of the present invention may be a single layer or a multi-layer substrate including at least one layer.

Also, a circuit pattern (not shown) for electrical connection may be formed between respective layers.

Here, while not shown in the drawings, an external connection terminal for connection to the outside may be formed on the substrate 100. At least one external connection terminal may be formed, and the via 400, which will be described later, may function as an external connection terminal of the substrate 100.

As the first electronic device 200 mounted on the both sides of the substrate 100, any various devices that may be mounted on the substrate 100, including a passive device and an active device, may be used.

The first electronic device 200 may be mounted on both of an upper surface and a lower surface of the substrate 100, in which the mounting electrode 102 is formed on the both sides thereof. The size or shape of the first electronic device 200 may be variously disposed according to the design of the semiconductor package 1000.

Figure 3:
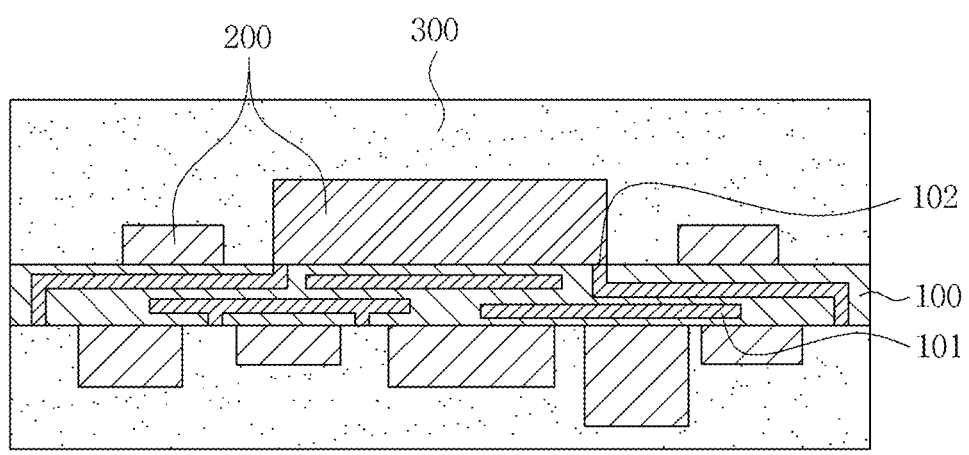

Next, referring to FIG. 3, a molding portion 300 is formed on the substrate 100 on which the first electronic device 200 is mounted.

The molding portion 300 that surrounds the substrate 100, the via 400, and the first and second electronic devices 200 and 500 is formed on the substrate 100 to thereby increase an adhesive force between the molding and the substrate 100.

As the molding portion 300 is formed, the problem such as delamination between the substrate 100 and a molding material may be reduced, and long-time reliability of the substrate 100 may be improved.

In addition, as heat is blocked due to the molding, heat radiation effects of radiating heat generated in the electronic devices may be provided.

The molding portion 300 may be formed of; for example, a silicone gel or an EMC, but is not limited thereto.

Also, the molding portion 300 is filled between the first and second electronic devices 200 and 500 mounted on the substrate 100, thereby preventing an electrical short circuit between the electronic devices.

Also, the molding portion 300 surrounds the outside of the electronic devices to fix the same, thereby safely protecting the electronic devices from an external impact.

The molding portion 300 may be formed of an insulating material including a resin material, such as an epoxy or the like.

Figure 4:
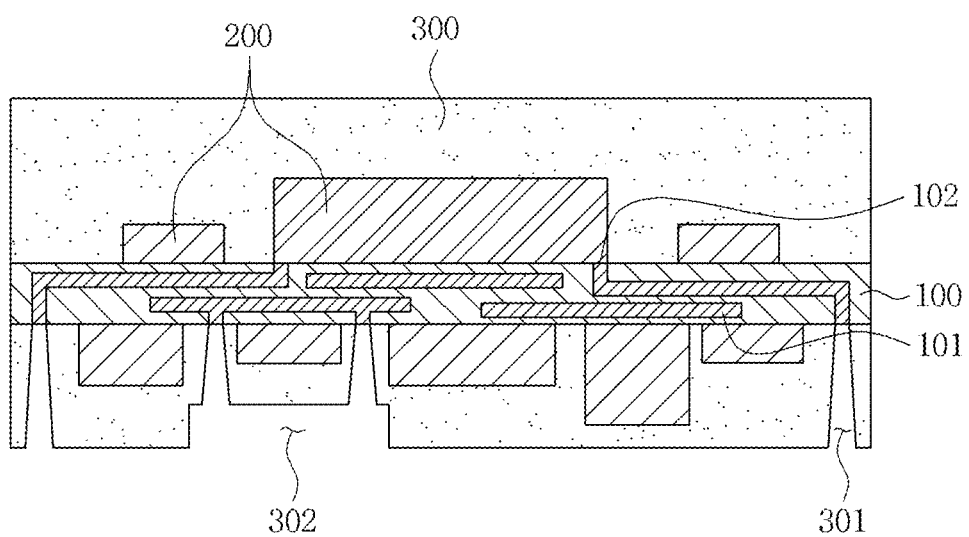

Next, referring to FIG. 4, a via hole 301 and an insertion portion 302 for a second electronic device are formed in the molding portion 300 by using laser processing.

Thicknesses, lengths, and the number of the via hole 301 and the insertion portion 302 for a second electronic device that are formed by boring by laser processing may be variously modified according to the design of the semiconductor package 1000 desired by the designer.

Also, the insertion portion 302 for a second electronic device may be formed according to the shape and size of the second electronic device 500 so that the second electronic device 500 which will be described later may be easily inserted.

Here, the via hole 301 and the insertion portion 302 for a second electronic device may be formed by drilling or laser processing. As a laser, $CO_2$, YAG/UV and Eximer laser may be used, but the type of laser is not limited according to preferred embodiments of the present invention.

Figure 5:
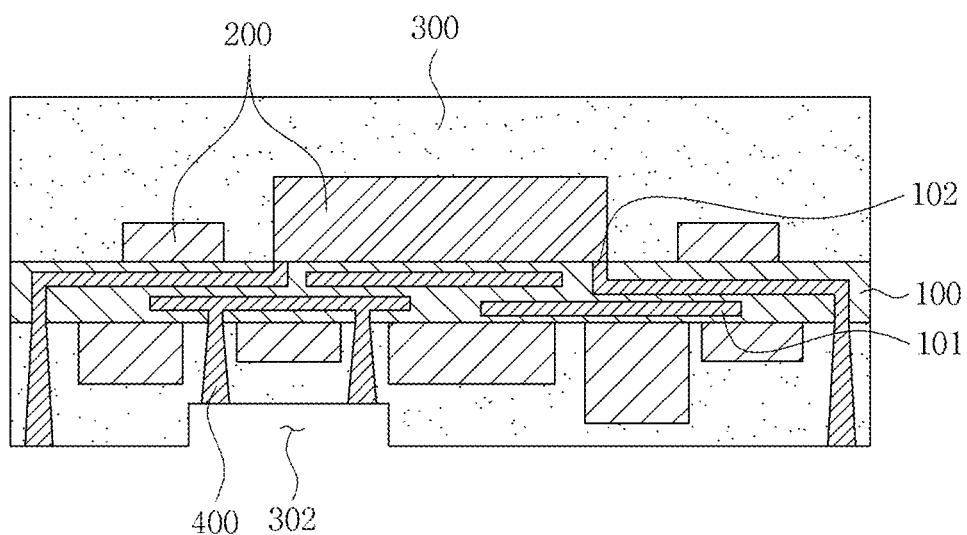

Next, referring to FIG. 5, a portion corresponding to the via hole 301 except the insertion portion 302 for a second electronic device is filled by plating to form the via 400.

The mounting electrode 102 formed on the substrate 100 and the wiring 101 formed in the substrate 100 may be electrically connected to other substrates (not shown) and/or the second electronic device 500 through the via 400.

At least one via 400 may be formed, and the vias 400 may have a uniform length and thickness or different lengths and thicknesses.

A filler of the via 400, through which the substrate 100 and the second electronic device 500 that is mounted at a distance from the substrate 100 are electrically connected, may be any material formed of a conductive metallic material, without being limited and copper is typically used.

Figure 6:
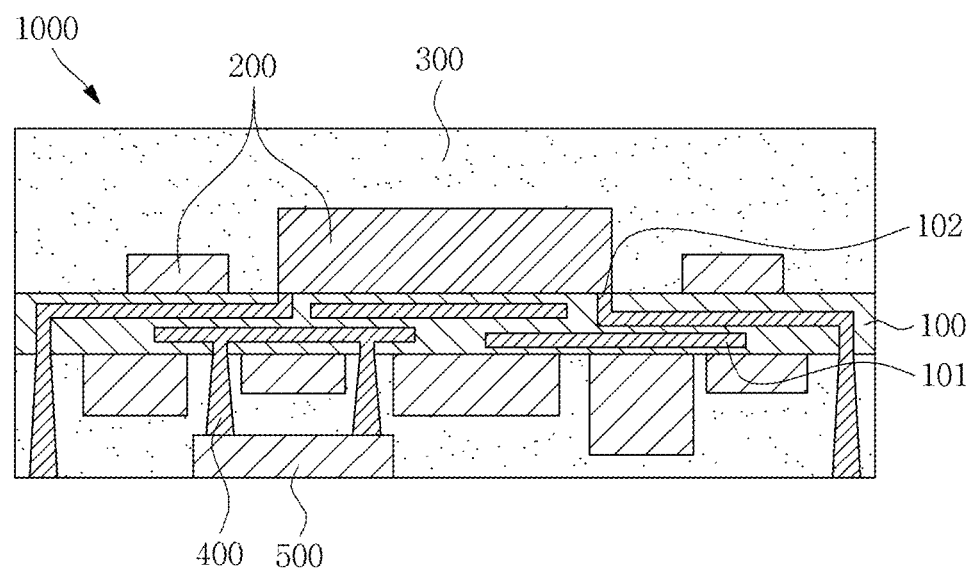

Next, referring to FIG. 6, the second electronic device 500 is inserted into the insertion portion 302 for a second electronic device.

While a pair consisting of the insertion portion 302 for a second electronic device and the second electronic device 500 is illustrated in the drawings according to the preferred embodiment of the present invention, more than one pair may be formed and be manufactured in a desired shape according to the design of the semiconductor package 1000.

The second electronic device 500 is mounted at a distance from the substrate 100, and the second electronic device 500 and the substrate 100 may be electrically connected through the via 400. While not shown in FIG. 6, a connection terminal formed in the second electronic device 500 may be connected to the conductive via 400 so that the substrate 100 and the second electronic device 500 may be electrically connected.

As the second electronic device 500, various devices such as a passive device and an active device may be used.

The size or shape may be variously changed according to a type and arrangement of an electronic device that a designer desires.

As the second electronic device 500 is connected to the substrate 100 through the via 400, the number and an area of electronic devices mounted on the substrate 100 may be reduced, thereby reducing a size of the semiconductor package 1000.

Accordingly, according to the semiconductor package 1000 and the method of manufacturing the same of the preferred embodiment of the present invention, an area occupied by an electronic device in the substrate 100 may be significantly reduced, thereby providing the semiconductor package 1000 having a compact size.

Also, it is easy to mount an external connection terminal and an electronic device in a package without a complicated process or using a pin, and thus, the processing time and costs may be reduced.

As set forth above, according to the structure of the semiconductor package of preferred embodiments of the present invention, an area occupied by an electronic device may be significantly reduced, thereby providing a semiconductor package having a compact size.

According to the method of manufacturing a semiconductor package of the preferred embodiment of the present invention, it is easy to mount an electronic device in a package, and moreover, the processing time and costs may be reduced.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A semiconductor package comprising:
   a substrate including a mounting electrode formed on both sides and a wiring;
   a plurality of first electronic devices mounted on the substrate;
   a plurality of second electronic devices mounted on the substrate;
   a molding portion that covers the substrate, the first and second electronic devices; and
   a via through which the wiring of the substrate and the second electronic devices are connected through the molding portion,
   wherein the second electronic devices are mounted at a distance from the substrate.

2. The semiconductor package as set forth in claim 1, wherein the via has a uniform length or different lengths.

3. The semiconductor package as set forth in claim 1, wherein the via has a uniform thickness or different thicknesses.

* * * * *